United States Patent [19]

Tibbetts

[11] 4,056,742

[45] Nov. 1, 1977

[54] TRANSDUCER HAVING PIEZOELECTRIC FILM ARRANGED WITH ALTERNATING CURVATURES

[75] Inventor: George C. Tibbetts, Camden, Maine

[73] Assignee: Tibbetts Industries, Inc., Camden, Maine

[21] Appl. No.: 682,130

[22] Filed: Apr. 30, 1976

[51] Int. Cl.² .................................................. H01L 41/04
[52] U.S. Cl. .................................... 310/357; 310/366; 310/367
[58] Field of Search .................... 310/8.2, 8.3, 8.5, 8.6, 310/9.1, 9.4, 9.8, 9.6, 9.5; 179/110 A

[56] References Cited

U.S. PATENT DOCUMENTS

| 3,781,955 | 1/1974 | Laurinenko | 310/9.6 X |
|---|---|---|---|
| 3,792,204 | 2/1974 | Murayama et al. | 310/8.2 X |
| 3,816,774 | 6/1974 | Ohnuki et al. | 310/8.6 |
| 3,832,580 | 8/1974 | Yamamuro et al. | 310/9.5 |
| 3,973,150 | 8/1976 | Tamura et al. | 310/8.2 X |
| 3,978,353 | 8/1976 | Kinoshita | 310/9.8 X |

Primary Examiner—Mark O. Budd

[57] ABSTRACT

A transducer of the type converting between electrical and mechanical energy by means of the piezoelectric effect in a supported sheet of uniaxially oriented, electrically polarized thin high polymer film such as polyvinylidene fluoride, having surface electrodes thereon for connection to an electrical circuit. The transducer is characterized by an arrangement of the piezoelectric film into a series of elongate curved cylindrical segments of alternating sign of curvature, with the surface electrodes on the film being divided in selected locations between adjacent segments. A useful level of elastic stability is achieved without using a static pressure difference on the film, good electromechanical coupling is attained, and the individual transducer elements formed by the divided surface electrodes may be usefully interrelated electrically to substantially cancel even order harmonic distortion and enhance linearity of operation.

22 Claims, 6 Drawing Figures

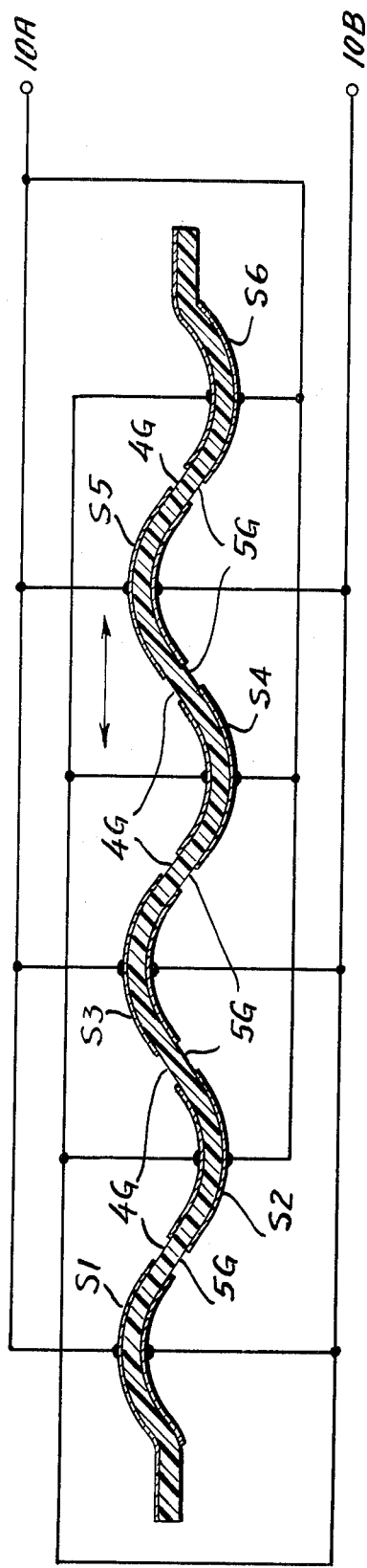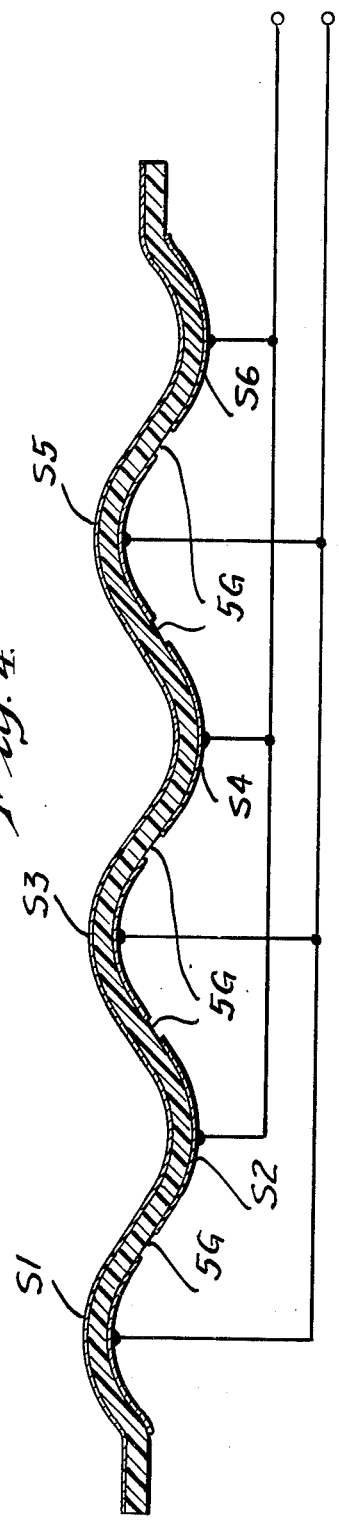

TRANSDUCER HAVING PIEZOELECTRIC FILM ARRANGED WITH ALTERNATING CURVATURES

BACKGROUND OF THE INVENTION

1. Field of the Invention

This invention relates to electromechanical or electroacoustical transducers, and more specifically to such transducers which convert between electrical and mechanical (including acoustical) energy by means of the piezoelectric effect available in thin high polymer films, such as polyvinylidene fluoride, which have been uniaxially oriented and electrically polarized, and have surface electrodes thereon for connection to electrical circuits.

2. Description of the Prior Art

Since its initial discovery through the work of Kawai, reported in 8 Japan. J. Appl. Phys. 975–976 (1969), the development of the piezoelectric effect in thin high polymer films by means of uniaxial orientation and subsequent electrical polarization has resulted in electromechanical coupling coefficients exceeding 15%. As with the work of Kawai this work has concentrated on polyvinylidene fluoride (abbreviated $PVF_2$), but improved materials can be expected in the future, as well as further improvement in the coupling coefficient of $PVF_2$.

The application of such films to practical transducers has been hindered by the unusual mechanical characteristics of the films compared with conventional piezoelectric materials and the forms in which they have been available. That is, the thinness and the low elastic modulus of the films present new problems in transducer structure, while at the same time these same characteristics, combined with the low mass/area ratios of the films, offer the potential for greatly improved transducer performance in several areas of application.

In applying piezoelectric films to use in electromechanical or electroacoustic transducers, the recent art has arranged the film in a primitive shell configuration, such as a cylinder or a portion of a cylinder, to transform between (1) strain in the film along the uniaxial direction (which corresponds to the largest piezoelectric effect) and tangent to the film surface, and (2) the motion normal to the film surface necessary if direct electroacoustic transduction and the accompanying low mass/area ratio are to be achieved.

In a cylindrical shell, for example, an acoustic pressure difference between the surfaces of the piezoelectric film is supported by the arch of the cylindrical form and is transformed in part into stress and strain tangential to the film and in the uniaxial direction. Because of the electromechanical coupling coefficient $k$ of the film, a signal voltage is generated between the electrodes on the film. Conversely, if an electrical signal is applied to the electrodes, strain is generated by the piezoelectric effect in the uniaxial direction, and the cylindrical form of the film changes by deflections normal to its surface, resulting in the output of acoustical energy.

However, the film is very thin, typically 8 to 30 microns, and its elastic modulus is low, typical of organic polymers. Thus elastic instability can set in at very low pressure differences, resulting in unacceptable harmonic distortion, failure of the frequency response to be approximately independent of signal level, and lack of reproducibility of performance characteristics in general. For example, an airborne shock wave or other acoustic overload can irreversibly damage or change the form of the film even to the point of substantially reversing its curvature. For these reasons, the level of elastic stability attainable with this configuration is insufficient for practical use.

One technique that has been used to supply elastic stability is that of mechanically biasing the transducer, i.e., by providing a static pressure on one side of the film so as to produce tension in the film in the uniaxial direction. Typically this pressure is supplied mechanically by a pad of flexible foam, held under compression by a perforated backing plate to cause it to exert pressure on the underside of the curved film, which consequently is placed under static tension. The acoustically active vibration of the film adds a dynamic component to the tension, but elastic stability is more than assured if the total tension does not reverse sign to become compressive.

The outstanding disadvantage of using compressed foam to develop a mechanical bias to procure elastic stability is the deleterious effect of the incremental stiffness of the foam on the effective electroacoustic coupling coefficient of the transducer. In most practical transducers there will be an air volume coupled to one side of the film and the acoustical compliance of this space is one of the most basic parameters that restricts the performance of the transducer. The incremental stiffness of the foam markedly decreases the effective acoustical compliance of this space, without any corresponding reduction in the space occupied by the transducer. Furthermore, the foam adds effective mass to that of the film, and most of the film's low mass/area ratio advantage is lost.

Another prior art solution providing mechanical bias by means of the tractive force of an electrical field is disclosed in U.S. Pat. No. 3,894,198, but this device requires a combination of a piezoelectric thin film transducer with an electrostatic transducer that is either externally or electret polarized.

Despite these efforts of the prior art, no transducer structures using high polymer piezoelectric films have approached in performance characteristics the full potential offered by the intrinsic properties of such films.

SUMMARY OF THE INVENTION

The principal object of the present invention is to provide an improved transducer of the type using a piezoelectric film as the transduction element. Further objects of this invention are to provide a piezoelectric thin film transducer that (1) is elastically stable in operation and use, (2) employs no static pressure difference on the film transducing element, (3) has an electromechanical coupling coefficient approaching that of the film itself, and (4) has minimal non-linearity of operation. Still another object of the invention is to provide a transducer structure which is more suitable for commercial manufacture and use.

In a particular embodiment of the invention to be described hereinbelow in detail, the transducer converts between electrical and mechanical energy by means of the piezoelectric effect in a supported sheet of uniaxially oriented, electrically polarized thin high polymer film with surface electrodes thereon, and is characterized in that the piezoelectric film is arranged with a series of curved substantially cylindrical segments of alternating sign of curvature, each of which is capable of functioning as a separate and distinct transducer element. The surface electrodes on the film, moreover, are divided, i.e., gapped, in selected locations between adjacent segments to interrelate electrically the separate transducer elements in a prescribed fashion, i.e., series, parallel, or series-parallel. When the number of segments is even, the second and other even-order harmonic distortion substantially cancels, and in any case improved linearity of operation results. At the same time, the provision of a number of supported cylindrical segments or arches confers elastic stability without the need for any static pressure means.

In further aspects of the invention, the piezoelectric film is supported upon a frame which has a pair of spaced surfaces containing curves of alternating curvature, across which the film is conformingly secured under fixturing tension, and the frame has ribs which support the film in locations between adjacent curved segments. The fixturing tension may or may not contribute significantly to the elastic stability of the film surface within the segments. When used for electroacoustic purposes, the transducer frame and film may be mounted within a casing having an acoustic opening therein.

Other objects, aspects and advantages of the invention will be disclosed in, or apparent from, the description hereinbelow of a preferred embodiment as illustrated in the accompanying drawings.

DESCRIPTION OF THE DRAWINGS

FIG. 3 is a schematic sectional view of another piezoelectric film according to the invention illustrating a parallel connection of transducer elements;

FIG. 4 is a schematic section view of still another piezoelectric film according to the invention, illustrating a particular series-parallel connection of transducer elements;

DESCRIPTION OF THE PREFERRED EMBODIMENT

Figure 1:
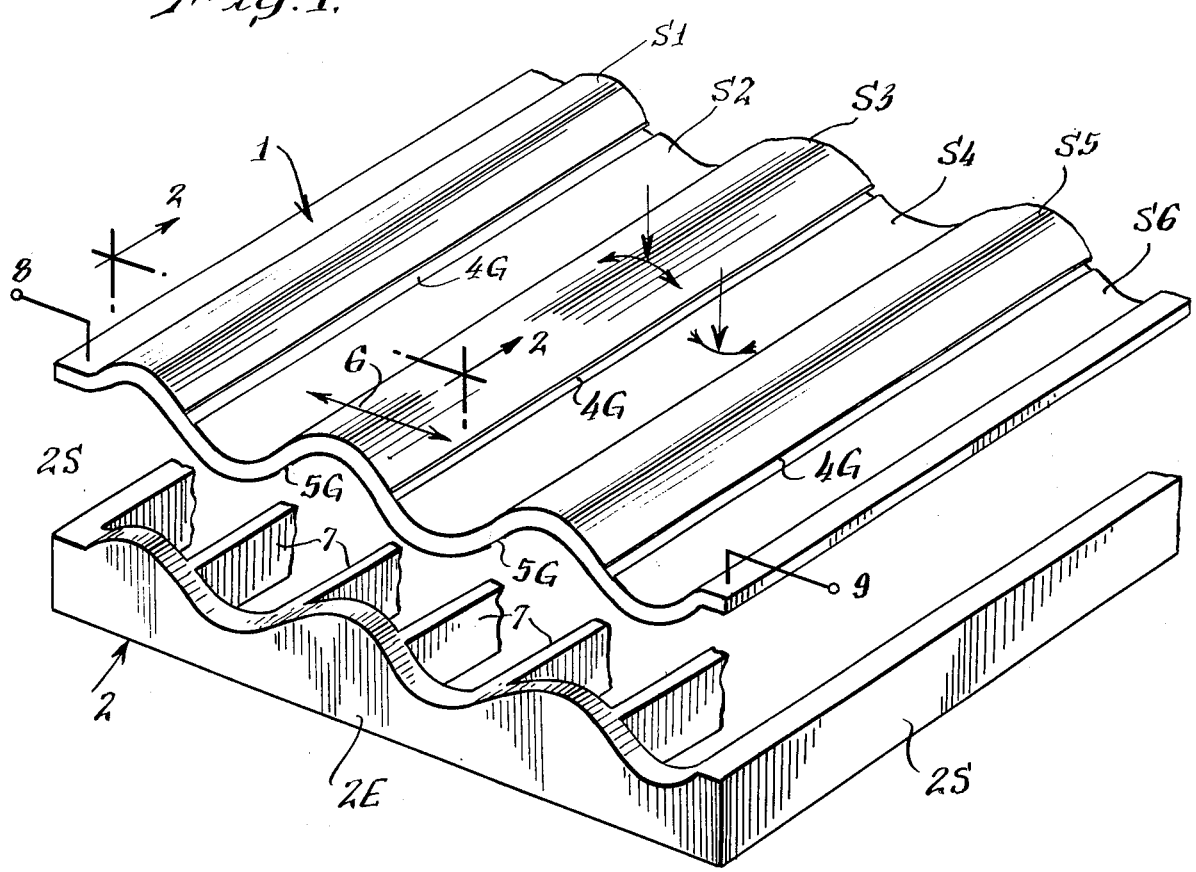
FIG. 1 is an exploded perspective view of a support and a sheet of piezoelectric film arranged for use in an electromechanical transducer in accordance with the present invention, but with other transducer elements omitted for clarity.
Figure 2:
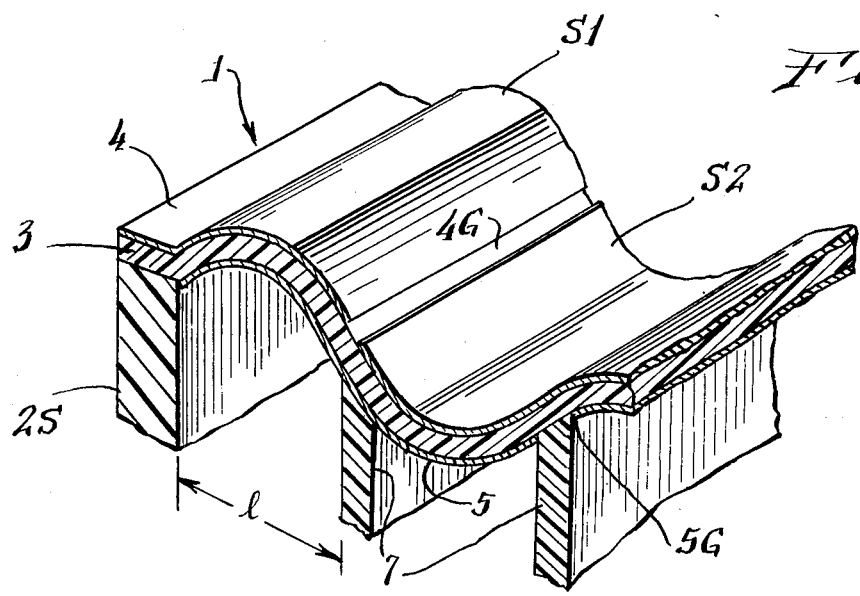
FIG. 2 is an enlarged sectional view of the piezoelectric film arrangement of FIG. 1, as taken on line 2—2 of FIG. 1.

Referring to the drawings, FIGS. 1 and 2 illustrate a piezoelectric thin film 1 arranged pursuant to the present invention for use in an electromechanical transducer, and a frame 2 which supports the piezoelectric film 1. For clarity of illustration, FIGS. 1 and 2 omit other transducer elements.

The piezoelectric film 1, as is typical, is constructed with a central polymer layer 3, e.g., of polyvinylidene fluoride, between an upper surface electrode 4, and a lower surface electrode 5. For clarity, the piezoelectric film 1 and its constituent elements are shown with exaggerated thickness. The electrodes 4 and 5 may be of vacuum metalized aluminum, and are very thin so that the low mass/area ratio of the film is not significantly increased. The film 1 is homogeneously polarized in the thickness direction, and the uniaxial direction or axis of the film extends in the plane of the film parallel to arrow 6. As is well known, when such a piezoelectric film is stressed or strained parallel to its uniaxial direction 6, one polarity of electrical signal is developed across surface electrodes 4 and 5 for compressive strain, and the opposite polarity is developed for tensive strain, and the piezoelectric effect is greatest for this orientation of stress or strain in the plane of the film. In certain instances a more complex laminate structure than shown in FIGS. 1 and 2 may be desirable; for example, to improve adhesion between the electrodes and the piezoelectric film. Laminate structures of the latter type are described in U.S. Pat. No. 3,912,830.

In accordance with the present invention, the piezoelectric film 1 is formed into a series of similar curved cylindrical segments, such as S1 through S6, having alternating sign of curvature. Preferably the segments are substantially congruent in cross-section one to another. Thus, as seen from the top, the piezoelectric film 1 has segments S1, S3 and S5 of convex curvature alternating with segments S2, S4 and S6 of concave curvature. The axes of the cylindrical segments extend perpendicular to the uniaxial direction 6 of the film. In the embodiment illustrated in FIG. 1 six segments are formed, each preferably comprising, approximately, a portion of a right circular cylinder. Other curved cylindrical shapes capable of suitably converting pressure differences across the film 1 into stress along the uniaxial direction 6 of the film 1 can also be employed. The number of segments to be formed depends on the size of the transducer, and the effective operating pressure it must withstand. In general, the span $l$ of each cylindrical segment is selected in relation to the mechanical properties of film 1 so that each cylindrical segment is elastically stable without mechanical bias over the range of effective pressure differences to be encountered.

As shown in FIGS. 1 and 2, the frame 2 supports the piezoelectric film 1 about its outer periphery with end walls 2E and side walls 2S. The end walls 2E have upper surfaces formed into alternating curved cylindrical segments which conform to the desired cross-sectional shape of the film 1. In addition, the frame 2 has a plurality of spaced longitudinal ribs 7 which extend parallel to the cylinder axes and support the film 1 at the junctures of adjacent cylindrical segments S1, S2, etc. The film 1 is thus supported in the regions where the film curvature reverses from concave to convex, and vice versa. As a result of the manner in which the piezoelectric film 1 is supported, each cylindrical segment forms a distinct transducer.

Accordingly, when a pressure difference is applied across the whole film, the convex segments S1, S3 and S5 will develop electrical signals with polarities opposite to the electrical signals developed in concave segments S2, S4 and S6. Pursuant to the present invention, the upper and lower surface electrodes 4 and 5 contain spaces or gaps 4G and 5G which divide the surface electrodes in selected locations at the junctures of adjacent segments, i.e., where the film curvature reverses. The spaces typically are formed in a completely electroded film, as by chemical or electrochemical etching.

By means of the spaces 4G and 5G the distinct transducer elements represented by segments S1 through S6 may be usefully interrelated. In the arrangement illustrated in FIGS. 1 and 2, the spaces in upper electrode 4 are located between segments S1 and S2, S3 and S4, and S5 and S6, and thus alternate with and are offset from the spaces in lower electrode 5, which are located between segments S2 and S3, and S4 and S5. The resulting portions of upper electrode 4 overlap with the portions of lower electrode 5, to place all of the transducer elements electrically in series. Because of the reversal of curvature between neighboring segments such as S1 and S2, the transducer elements are placed in series in such a way that the electrical signals developed across the piezoelectric transducer elements are additive and produce a total electrical signal voltage at output terminals 8 and 9 that has a magnitude of approximately six times the signal developed across a single segment. The effects of leakage capacitance reduce this multiplier somewhat from the ideal value of six.

Suitable interrelation of the segments, such as the additive series connection of film segments S1 through S6 illustrated in FIGS. 1 and 2, has an important advantage in that it improves transducer performance and linearity by cancelling even order harmonic distortion. At high acoustic pressures the maximum displacements of the transducer elements can become significant relative to the height of the cylindrical arches. For example, downward displacements decrease the height of the convex arches but increase the height of the concave arches. In any one transducer element, the corresponding asymmetry of operation under positive and negative displacements causes asymmetry in the mechanical coupling between pressure difference on the film and stress in the uniaxial direction of the film. In consequence the dominant non-linearity of a single transducer element appears in the form of second order harmonic distortion. However, the phase of the second (and all even-order) harmonic distortion is opposite between convex and concave transducer elements. Thus if all transducer elements are similar with the exception of sign of curvature, and if the number of concave elements equals the number of convex elements, the even-order harmonic distortions associated with the individual segments are placed in opposition, and the even-order harmonic distortion substantially cancels in the total electrical signal voltage at output terminals 8 and 9 of the multi-element transducer. In this way the non-linearity of the transducer is minimized, the remaining non-linearity appearing substantially as third and higher odd-order harmonic distortion.

The transducer elements S1 through S6 need not be placed in series however. As shown in FIG. 3, spaces 4G and 5G may be provided in electrodes 4, 5 so that each transducer element, for example S1, has a separate pair of electrodes. All electrodes of one electrical polarity may be interconnected by electrically conductive means, formed in part if desired by the pattern of etching of the surface electrodes 4 and 5, extending near one edge of the film parallel to the direction 6, and all electrodes of the other electrical polarity may be similarly connected by means near the opposite edge of the film, as indicated schematically by the connections shown in FIG. 3 leading to output terminals 10A and 10B.

In addition to the series connection of elements shown in FIG. 1 and the parallel connection shown in FIG. 3, a number of series-parallel connections can be utilized. An example is shown in FIG. 4, wherein a series connection is made between adjacent elements S1 and S2, S3 and S4, and S5 and S6, and the three sets of series-connected elements are then connected in parallel. Series-parallel connections are of some importance because the number of transducer elements may be quite large, and the required impedance level of the transducer may not be compatible with an all-series or all-parallel connection of elements.

Figure 5:
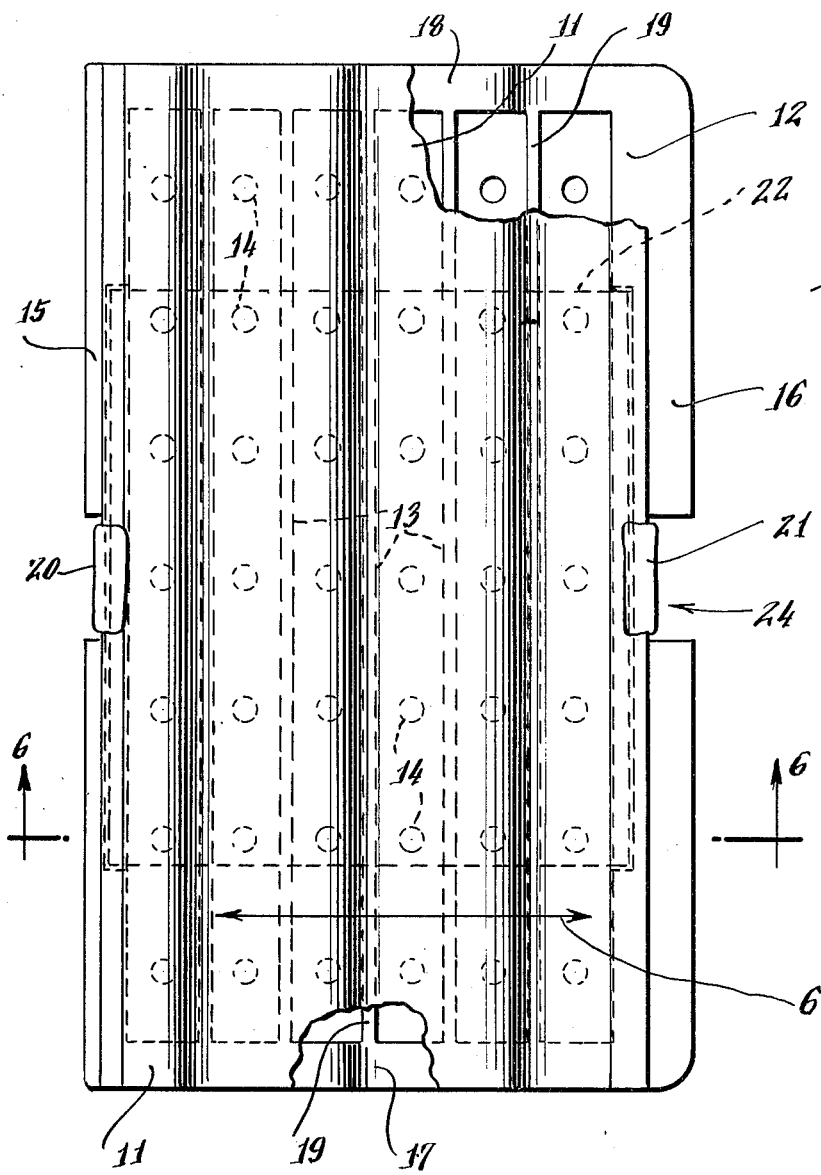
FIG. 5 is a plan view of an electroacoustic transducer using a piezoelectric film supported in accordance with the present invention, with the transducer casing omitted.
Figure 6:
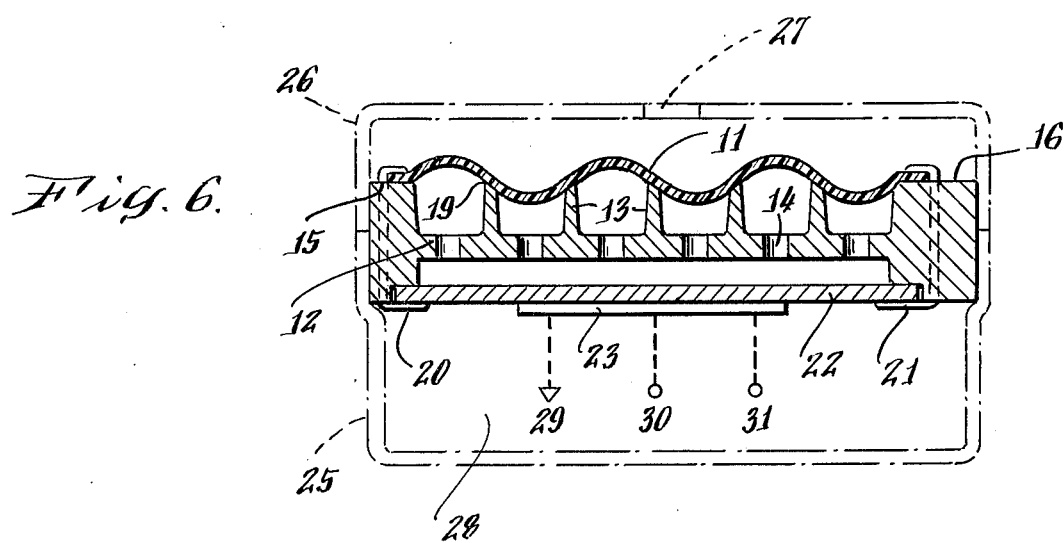
FIG. 6 is a section on line 6—6 of FIG. 5, showing the transducer casing in dotted lines.

FIGS. 5 and 6 illustrate a complete electromechanical transducer structure of a type suitable, for example, for use as a miniature hearing aid microphone, In the transducer a piezoelectric film 11, similar to film 1 shown in FIG. 1, is bonded by adhesive to a support 12 which is molded from an electrically insulating plastic. The support 12 has an integral frame which on its top surface has flats 15 and 16, and non-flat surfaces 17 and 18 which, like the upper surfaces of end walls 2E shown in FIG. 1, follow the contour of film 11 as shown in FIG. 6. The support 12 also has integral ribs 13 having top surfaces 19 which are straight along the ribs but which follow the surfaces 17 and 18 transverse to the ribs. The support 12 has perforations 14 which provide communication between the underside of film 11 and air space 28.

Prior to assembly on the support 12, the film member 11 is longer than shown in FIG. 5 so that fixturing tension may be applied to it parallel to the ribs 13. The film member 11 is then brought down onto the adhesive coated support 12, the tension serving in part to conform the film member to the surfaces 17, 18, and 19 and portions of 15 and 16, and to force the film member to take on in cross section substantially the form of the surfaces 17 and 18 throughout the length of the ribs 13 (as indicated in FIG. 6). The rib surfaces 19 substantially face the electrode spaces 4G and 5G of FIG. 1, so as to minimize capacitive shunting of the transducer by those portions of the film member 11 rendered electromechanically inactive by bonding to the surfaces 19. After completion of bonding the film member 11 is trimmed to the length shown in FIG. 5, and some tension remains in the film member parallel to the ribs 13.

A ceramic substrate 22, bearing on its bottom surface fired conductive coatings forming leads to an encapsulated junction field effect transistor (JFET) source follower 23, is adhesive bonded into a recess in the support 12. Conductive coatings 20 and 21, e.g., silver pigmented epoxy coatings, extend along channels in the frame of support 12 to make contact between the outermost electrodes of film member 11 and corresponding leads on the substrate 22. The coating 21 connects to the gate lead of the source follower, and accordingly the channel for 21 is deeper to reduce leakage capacitance to a metallic casing 25 and cover 26 around the film 11 and support 12. The casing 25 and cover 26, which define an acoustic cavity on each side of the film 11, are shown dotted to indicate a particular electroacoustic transducer incorporating this electromechanical embodiment of the invention. The casing cup 25 is drawn with a slight land on which the support 12 rests for fixturing purposes. The space 24 in one of the channels between the support and the casing wall is sealed except for the provision of an acoustic vent or other acoustic impedance element. For example, the space 24 may be sealed by a non-corrosive silicone sealant, and the vent formed by the withdrawal of an abhesive surfaced monofilament or wire fro the curved sealant. The remainder of the support 12 is sealed and bonded to the wall of the casing 25 by an adhesive such as epoxy, and the cover 26 is similarly sealed and bonded to the support 12 and top edge of the casing 25, the support 12 serving to locate transversely the cover with respect to the casing. The cover 26 contains an acoustic inlet 27, which may contain or be overlaid by acoustic damping means, and which functions as an acoustic connection through the wall of the casing to the acoustic cavity within the casing above the film 11. Wire leads extend from the substrate 22 to terminals in the casing wall, indicated schematically by 29, 30, 31. Terminal 31 connects to the drain and terminal 30 connects to the source of the JFET contained in the source follower 23. DC electrical power may be supplied by a cell or other means to the terminal pair 31 and 29, in which case the electrical signal output from the source follower is developed between terminals 30 and 29.

The electroacoustical transducer indicated in FIG. 6 is an omnidirectional pressure operated microphone. Acoustic volume displacement entering or leaving the inlet 27 causes mechanical displacement of each of the cylindrical arches formed by the film member 11 between any adjacent pair of the ribs 13, and these displacements have approximately the same phase. Thus for example downward displacements place in compression, in the direction roughly corresponding to 6 in FIG. 1, the film portions that form convex arches, and place in tension the film portions that form concave arches. The resulting alternation of electrical signal fields between adjacent transducer elements, generated by the piezoelectric effect in the thickness direction of the homogeneously polarized film, is precisely that needed for the all-series electrode configuration of FIG. 1. The conductive coatings 20 and 21, acting like the leads to the terminals 8 and 9 of FIG. 1, convey the total electrical signal voltage to the input of the source follower 23, which in turn drives the output terminals 30 and 29.

The elastic stability required in a practical transducer is obtained in this invention by (1) the flexural stiffness of the film as supported and fixed, or (2) by a combination of such flexural stiffness and that tension in the film which remains after fixturing and assembly to the support.

The critical pressure difference for the onset of elastic buckling of a cylindrical arch is strongly dependent on its span because of the effect of flexural stiffness. Indeed, in the absence of flexural stiffness the critical pressure difference is zero if in addition there are no membrane stresses that oppose buckling. As indicated in FIGS. 1 and 6, the critical pressure difference for a thin high polymer piezoelectric film is raised to a useful value by dividing the extent of the film member 11 into a number of arches of relatively small span, each arch being substantially supported and fixed by an adjacent pair of ribs 13.

The use of flexural stiffness as the primary means of obtaining a useful critical pressure difference incurs some reduction in the effective electromechanical coupling coefficient of the film transducer. Indeed, any means of obtaining sufficient elastic stability will cause a reduction in effective electromechanical coupling coefficient. However, the use of flexural stiffness is highly effective and easy to control in raising the critical pressure difference, and so the reduction of coupling coefficient is minimized while the low mass/area ratio of the film is fully preserved.

The electromechanical coupling coefficient of the film is also more nearly realized by a natural consequence of the structures of this invention. As illustrated in FIG. 5, the transducer elements are very elongate, while the uniaxial direction 6 is transverse to the long dimensions. At the ends of each element the film member 11 is constrained by the support 12 at the surfaces 17 and 18 such that the film cannot be strained appreciably in the uniaxial direction. The effect of this constraint decays rapidly away from the ends of the element, but the net effect is to create a "dead" portion of the element that is electromechanically inactive but, if the element is completely electroded over its length, has electrical capacitance in shunt with the "active" portion of the element. This equivalent to capacitive shunting reduces the effective electromechanical coupling coefficient, but in this invention the effect is minimal because, as a direct consequence of the highly elongate shape of each element, the area of the "dead" portion is small relative to the area of the element.

FIG. 6 illustrates an omnidirectional microphone embodiment of this invention, but the same electromechanical assembly, and its associated source follower if desired, is applicable to a variety of directional microphone structures, the film member 11 being used to sense pressure difference between the two acoustic spaces on each side of it.

The electromechanical transducer of FIGS. 5 and 6 is also applicable to headphone and loudspeaker tweeter applications, provided that the excursion of the film element 11 is not required to exceed roughly the film thickness and therefore that an acceptable degree of linearity can be obtained. In addition, in such applications the all-parallel connection of FIG. 3 may replace the all-series connection of FIG. 1 in order to reduce the required electrical signal driving voltage as much as possible. For example, in a device in which the film element of FIG. 3 is substituted for the film element 11 of FIGS. 5 and 6, the electrical input signal is applied to terminals corresponding to 10A and 10B from a transformer, electronic amplifier, or other means. This signal causes the transducer elements to vibrate approximately in phase acoustically, and the resultant acoustic volume displacement causes acoustic pressure in a cavity or the radiation of acoustic energy outward from the transducer, as the case may be. The discussions above concerning elastic stability, effective electromechanical coupling coefficient, and even-order harmonic distortion cancellation are applicable to these sound generating embodiments of the invention as well.

Although a specific embodiment of the invention has been disclosed herein in detal, it is to be understood that this is for the purpose of illustrating the invention, and should not be construed as necessarily limiting the invention, since it is apparent that many changes can be made to the disclosed structures by those skilled in the art to suit particular applications.

I claim:

1. A transducer of the type converting between electrical and mechanical energy by means of the piezoelectric effect in a supported sheet of uniaxially oriented, electrically polarized high polymer film having surface electrodes thereon for connection to an electrical circuit, characterized in that:

the piezoelectric film is arranged with a series of curved substantially cylindrical segments of alternating sign of curvature, the film being fixedly supported in locations between adjacent segments and being freestanding between said locations, whereby each curved segment functions as a distinct electromechanical transducer, and the surface electrodes on the film are divided in selected locations between adjacent segments, whereby the series of individually supported curved segments imparts useful elastic stability to the piezoelectric film, and the individual transducers formed by the supported curved segments and divided surface electrodes may be interconnected electrically to obtain desired transfer and impedance characteristics in the transducer.

2. A transducer as claimed in claim 1 wherein the surface electrodes are divided to place an adjacent pair of segments of opposite curvature electrically in series.

3. A transducer as claimed in claim 2 further comprising a non-adjacent pair of curved segments connected electrically in parallel.

4. A transducer as claimed in claim 1 further comprising interconnections placing the curved segments electrically in parallel.

5. A transducer as claimed in claim 1 wherein the curved segments are substantially congruent one to another in cross section, and wherein the divided surface electrodes are electrically interconnected to cause even order harmonic distortions associated with individual curved segments to be placed in opposition to reduce the total even order harmonic distortion of the transducer.

6. A transducer as claimed in claim 5 wherein the curved segments are even in number and the even order harmonic distortion substantially cancels.

7. A transducer as claimed in claim 1 wherein the curved segments are elongate and substantially are portions of circular cylinders.

8. A transducer as claimed in claim 1 further comprising means providing additional support to the the piezoelectric film, said means comprising spaced surfaces conforming to the alternating curved configuration of the film and means for securing the film to the spaced surfaces.

9. A transducer as claimed in claim 8 wherein the piezoelectric film is under tension between the spaced surfaces.

10. A transducer as claimed in claim 8 wherein support for the piezoelectric film in locations between adjacent segments is provided by ribs extending along the segments and between the additional support means.

11. A transducer as claimed in claim 1 wherein the piezoelectric film is supported about its periphery as well as in locations between adjacent curved segments, and the curved segments are elongate, whereby effectively inactive regions of the film near the supported ends of the segments are small in area relative to the total area of the segments.

12. An electroacoustic transducer utilizing the piezoelectric effect in a supported sheet of uniaxially oriented, electrically polarized high polymer film having surface electrodes thereon for connection to an electrical circuit, characterized by:
means for supporting the film comprising a frame for supporting the film about its periphery and having a pair of spaced surfaces which comprise a series of curved substantially cylindrical segments having alternating curvatures to which the film is conformingly secured, thereby to form a corresponding series of curved substantially cylindrical segments of alternating sign of curvature in the film, and ribs extending between the pair of spaced surfaces for supporting the film in locations between adjacent segments, whereby each curved segment functions as a distinct electroacoustic transducer element and useful elastic stability is conferred upon the piezoelectric film, and
the surface electrodes on the film are divided in selected locations between adjacent segments to allow electrical connections to the transducer elements in a prescribed manner.

13. An electroacoustic transducer as claimed in claim 12 further comprising a casing to which the support means is mounted, the casing providing at least one acoustic cavity coupled to the piezoelectric film.

14. An electroacoustic transducer as claimed in claim 13 further comprising an acoustic connection through a wall of the casing and extending to an acoustic cavity.

15. An electroacoustic transducer as claimed in claim 12 wherein the curved segments are similar one to another, and further comprising electrical connections to the transducer elements to cause even-order harmonic distortions associated with individual transducer elements to be placed in opposition to reduce the total even-order harmonic distortion in an electroacoustic transfer characteristic of the transducer.

16. An electroacoustic transducer as claimed in claim 15 wherein the curved segments are even in number and the even-order harmonic distortion substantially cancels.

17. An electroacoustic transducer as claimed in claim 12 wherein the curved segments are elongate and substantially are portions of circular cylinders.

18. An electroacoustic transducer as claimed in claim 12 wherein the piezoelectric film is under tension between said pair of spaced surfaces.

19. A transducer utilizing the piezoelectric effect in a supported sheet of uniaxially oriented, electrically polarized high polymer film having surface electrodes thereon for connection to an electrical circuit, characterized in that:
the piezoelectric film is in the form of a series of segments of substantially arcuate cross-section and alternating curvature,
a plurality of ribs extends along the segments for supporting the film in locations between adjacent segments,
whereby each segment functions as a distinct transducer element and useful elastic stability is conferred upon the piezoelectric film, and
the surface electrodes on the film are divided in selected locations between adjacent segments to allow electrical connections to the transducer elements in a prescribed manner.

20. A transducer as claimed in claim 19 wherein the segments are similar to one another, and further comprising electrical connections to the transducer elements to cause even-order harmonic distortions associated with individual transducer elements to be placed in opposition to reduce the total even-order harmonic distortion of the transducer.

21. A transducer as claimed in claim 20 wherein the segments are even in number and the even-order harmonic distortion substantially cancels.

22. A transducer as claimed in claim 19 wherein the segments are elongate and substantially are portions of circular cylinders.

* * * * *